United States Patent
Kaneko et al.

(10) Patent No.: US 7,903,220 B2
(45) Date of Patent: Mar. 8, 2011

(54) LIQUID CRYSTAL DISPLAY DEVICE AND ELECTRONIC APPARATUS

(75) Inventors: Hideki Kaneko, Tottori (JP); Masahiro Horiguchi, Tottori (JP); Osamu Kobayashi, Tottori (JP)

(73) Assignee: Sony Corporation, Tokyo (JP)

( * ) Notice: Subject to any disclaimer, the term of this patent is extended or adjusted under 35 U.S.C. 154(b) by 376 days.

(21) Appl. No.: 12/197,599

(22) Filed: Aug. 25, 2008

(65) Prior Publication Data

US 2009/0086143 A1   Apr. 2, 2009

(30) Foreign Application Priority Data

Oct. 1, 2007   (JP) ................................ 2007-257177
Jun. 16, 2008   (JP) ................................ 2008-156290

(51) Int. Cl.
*G02F 1/1343*   (2006.01)
*G02F 1/1345*   (2006.01)

(52) U.S. Cl. ......... 349/141; 349/148; 349/143; 349/149; 349/139

(58) Field of Classification Search ................ 349/141, 349/143, 148, 149, 139
See application file for complete search history.

(56) References Cited

U.S. PATENT DOCUMENTS

| 6,774,956 | B2 * | 8/2004 | Ono et al. | 349/39 |
| 7,338,824 | B2 * | 3/2008 | Shih | 438/30 |
| 7,636,144 | B2 * | 12/2009 | Horiguchi et al. | 349/141 |
| 2003/0133053 | A1 * | 7/2003 | Ono et al. | 349/38 |

FOREIGN PATENT DOCUMENTS

| JP | A-2001-235763 | 8/2001 |
| JP | A-2002-182230 | 6/2002 |
| JP | A-2007-226199 | 9/2007 |

* cited by examiner

*Primary Examiner* — Mike Qi
(74) *Attorney, Agent, or Firm* — K&L Gates (57) ABSTRACT

Provided is a liquid crystal display device including: a pair of transparent substrates including a liquid crystal layer interposed therebetween, wherein, at the liquid crystal layer side of one of the pair of transparent substrates, a plurality of scan lines and a plurality of signal lines are arranged in a display area in a matrix, first electrodes are formed in pixel areas partitioned by the scan lines and the signal lines, a second electrode is formed on the first electrodes with an insulating film interposed therebetween over at least the display area, a common line is formed outside the display area, and the second electrode is electrically connected to the common line via a low-resistance line which is formed along at least one side of the display area.

8 Claims, 7 Drawing Sheets

LIQUID CRYSTAL DISPLAY DEVICE AND ELECTRONIC APPARATUS

BACKGROUND

1. Technical Field

The present invention relates to a liquid crystal display device and an electronic apparatus having low crosstalk, good display quality and a wide viewing angle.

2. Related Art

A liquid crystal display device includes a pair of transparent substrates in which electrodes are formed on the surfaces thereof, and a liquid crystal layer sandwiched between the pair of substrates. A vertical electric field type liquid crystal display device for rearranging liquid crystal by applying a voltage to the electrodes formed on the both substrates and displaying a variety of information is widely used. A twisted nematic (TN) mode liquid crystal display device is generally used as the vertical electric field type liquid crystal display device. However, since the TN mode liquid crystal display has a problem that a viewing angle is narrow, various improved vertical electric field type liquid crystal display devices such as a vertical alignment (VA) mode liquid crystal display device or a multidomain vertical alignment (MVA) mode liquid crystal display device have been developed.

Meanwhile, unlike the vertical electric field type liquid crystal display device, an in-plane switching (IPS) mode or a fringe field switching (FFS) mode liquid crystal display device, in which a pair of electrodes including a pixel electrode and a common electrode is formed on only one substrate, is known.

Among them, in the IPS mode liquid crystal display device, the pair of electrodes is arranged on the same layer and the direction of the electric field applied to the liquid crystal is substantially parallel to the substrate such that liquid crystal molecules are rearranged in the direction parallel to the substrate. Accordingly, the IPS mode liquid crystal display device is also called a lateral electric field type liquid crystal display device and is advantageous in that a viewing angle is wide, compared with the vertical electric field type liquid crystal display device. However, since the pair of electrodes is provided on the same layer in the IPS mode liquid crystal display device, the liquid crystal molecules located on the pixel electrode are not sufficiently driven and thus transmissivity may deteriorate.

In order to solve the problem of the IPS mode liquid crystal display device, the FFS mode liquid crystal display device which is called a tilted electric field type liquid crystal display device has been developed (see JP-A-2001-235763 and JP-A-2002-182230) In the FFS mode liquid crystal display device, a pixel electrode and a common electrode for applying an electric field to a liquid crystal layer are formed on different layers with an insulating film interposed therebetween.

The FFS mode liquid crystal display device is characterized in that a viewing angle is wide, contrast is high, low voltage driving is realized, transmissivity is high, and a bright display is realized, compared with the IPS mode liquid crystal display device. In addition, in the FFS mode liquid crystal display device, since an overlapping area between the pixel electrode and the common electrode is larger than that of the IPS mode liquid crystal display device in plan view, large storage capacitance is generated and thus a separate supplementary capacitive line does not need to be provided.

Meanwhile, in the FFS mode liquid crystal display device, a pixel electrode or a common electrode is formed on a planarization film used in the VA or MVA type liquid crystal display device in order to prevent a step difference from being generated in the surface of the pixel electrode or a switching element (see JP-A-2007-226199).

In JP-A-2007-226199, in the case where the pixel electrode or the common electrode is formed on the planarization film, any one of an electrode (hereinafter, referred to as an upper electrode) formed on the insulating film and an electrode (hereinafter, referred to as a lower electrode) formed below the insulating film may be used as the pixel electrode and the common electrode. If the lower electrode is used as the pixel electrode, since the lower electrode can extend to the vicinity of a thin-film transistor (TFT) which is a switching element and the vicinity of a signal line and a scan line, an aperture is increased and thus a liquid crystal display panel for realizing a bright display can be obtained. Although a plurality of slits needs to be formed in the upper electrode in a pixel area, the upper can be solidly formed. Accordingly, the resistance of the upper electrode is decreased as the common electrode and thus the potential of the common electrode is stabilized. Thus, the FFS mode liquid crystal display device with good display quality can be obtained.

In contrast, if the upper electrode is used as the common electrode, since slits are formed in the upper electrode, a step difference is generated and thus a burn-in phenomenon occurs due to the step difference. In order to suppress the burn-in phenomenon, the step difference of the upper electrode should be decreased. Accordingly, it may be considered that the thickness of the upper electrode is as small as a half (about 50 nm) of the thickness of the lower electrode. However, since the upper electrode is formed of a conductive material such as ITO or IZO, if the thickness of the upper electrode is small, the resistance value of the upper electrode is increased. In addition, since the plurality of slits are formed in the upper electrode, the resistance value of the upper electrode is larger than that of the upper electrode which is solidly formed. If the resistance value of the upper electrode is increased, the applied signal electrically deteriorates and thus a predetermined driving potential is not properly applied to the liquid crystal layer. Thus, crosstalk occurs. The crosstalk remarkably occurs in a laterally long liquid crystal display device called a wide size.

SUMMARY

The invention is contrived to solve at least a portion of the above-described problems and can be realized by the following aspects.

According to an aspect of the invention, there is provided a liquid crystal display device including: a pair of transparent substrates including a liquid crystal layer interposed therebetween, wherein, at the liquid crystal layer side of one of the pair of transparent substrates, a plurality of scan lines and a plurality of signal lines are arranged in a display area in a matrix, first electrodes are formed in pixel areas partitioned by the scan lines and the signal lines, a second electrode is formed on the first electrodes with an insulating film interposed therebetween over at least the display area, a common line is formed outside the display area, and the second electrode is electrically connected to the common line via a low-resistance line which is formed along at least one side of the display area.

By this configuration, the second electrode (for example, the upper electrode) is electrically connected to the common line via the low-resistance line of which the resistance is sufficiently smaller than that of the resistance of the second electrode, in every column or every plural columns of the pixel areas. Accordingly, since the apparent resistance of the second electrode is decreased, the potential of the second electrode applied via the common line is stabilized and thus a liquid crystal display device having low crosstalk can be obtained.

A conductive material such as ITO or IZO may be used as the first electrode and the second electrode. In this case, the first electrodes and the second electrode may be formed of the same composition or different compositions. As a switching element connected to the electrodes, a three-terminal element such as a p-Si (polysilicon) thin film transistor (TFT) element, an a-Si (amorphous silicon) TFT element or a low temperature polysilicon (LTPS) TFT element, or a two-terminal nonlinear element such as a thin film diode (TFD) may be used.

In the liquid crystal display device, the low-resistance line may be formed between the display area and the common line in plan view.

By this configuration, the second electrode and the low-resistance line can be connected although the area of the second electrode is not increased more than necessary (for example, up to the outside of the common line). If a space exists between the display area and the common line, the low-resistance line can be formed using a portion of the space. Accordingly, the area of the display area does not need to be reduced in order to form the low-resistance line and thus the space can be efficiently used.

As described above, the low-resistance line may be formed along at least one side of the display area. That is, in the liquid crystal display area, since the low-resistance line is provided between the display area and the common line on the side in which the common line is formed in the display area, the low-resistance line is provided on the outside of the display area on the side in which the common line is not formed, and the second electrode is electrically connected to the low-resistance line, the potential of the second electrode functioning as the common electrode is stabilized and thus a liquid crystal display device having good display quality can be obtained.

In the liquid crystal display device, the low-resistance line may be formed so as to overlap with the second electrode which extends to the outside of the display area in plan view.

By this configuration, it is possible to decrease the size of the liquid crystal display device, compared with the case where the low-resistance line is provided on the outside of the second electrode.

In the liquid crystal display device, the both ends of the low-resistance line may be electrically connected to the common line.

By this configuration, when the both ends of the low-resistance line are electrically connected to the common line, the apparent resistance of the second electrode is further decreased, compared with the case where one end of the low-resistance line is connected to the common line. Thus, the better effect can be obtained.

In the liquid crystal display device, the common line may be positioned at a position separated from the display area in parallel, and the low-resistance line and the common line may be electrically connected via a connection line.

By this configuration, the second electrode (for example, extends in a row direction) is connected to the common line by the low-resistance line and the connection line formed between the common line and the low-resistance line (for example, in a column direction). Accordingly, since the apparent resistance of the second electrode is further decreased, the better effect can be obtained. The connection line may be formed in every column of the pixel areas formed in the display area or every plural columns. When the connection line is formed in every column of the pixel areas formed in the display area, the apparent resistance of the second electrode is further decreased.

In the liquid crystal display device, the low-resistance line and the connection line may be formed of the same material as the scan lines or the signal lines.

By this configuration, since the low-resistance line and the connection line can be simultaneously formed with the scan lines or the signal lines, it is possible to readily form the low-resistance line and the connection line without changing a manufacturing process.

In the liquid crystal display device, the display area may have a rectangular shape, and the low-resistance line may be formed in a longitudinal direction of the display area.

By this configuration, since the low-resistance line is formed in the longitudinal direction of the display area and the common line and the second electrode are electrically connected via the low-resistance line, it is possible to suppress the resistance of the both ends of one side of the second electrode from be increased in plan view, compared with the low-resistance line is formed in the short direction of the display area. That is, it is possible to further decrease the resistance of the second electrode by providing the low-resistance line in the longitudinal direction so as to be connected to the common line. Although the low-resistance line may be formed on at least one of the upper side and the lower side of the column direction on the outside of the display area, when the low-resistance line is formed on the both sides of the column direction, the resistance of the second electrode is further decreased and thus the better effect can be obtained.

According to another aspect of the invention, there is provided an electronic apparatus including the liquid crystal display device.

By this configuration, it is possible to obtain an electronic apparatus including a liquid crystal display device having a wide viewing angle and good display quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. In the following embodiments, a liquid crystal display device for embodying the technical spirit of the invention is described. The invention is not limited to the liquid crystal display device. Accordingly, the invention is applicable to other embodiments included in claims. In each view used for following description, the scale of each layer or each element is differentiated from each other in order that each layer or each element has a size capable of being identified in the view. That is, each layer or each element may not be necessarily proportional to an actual size thereof.

Figure 1:
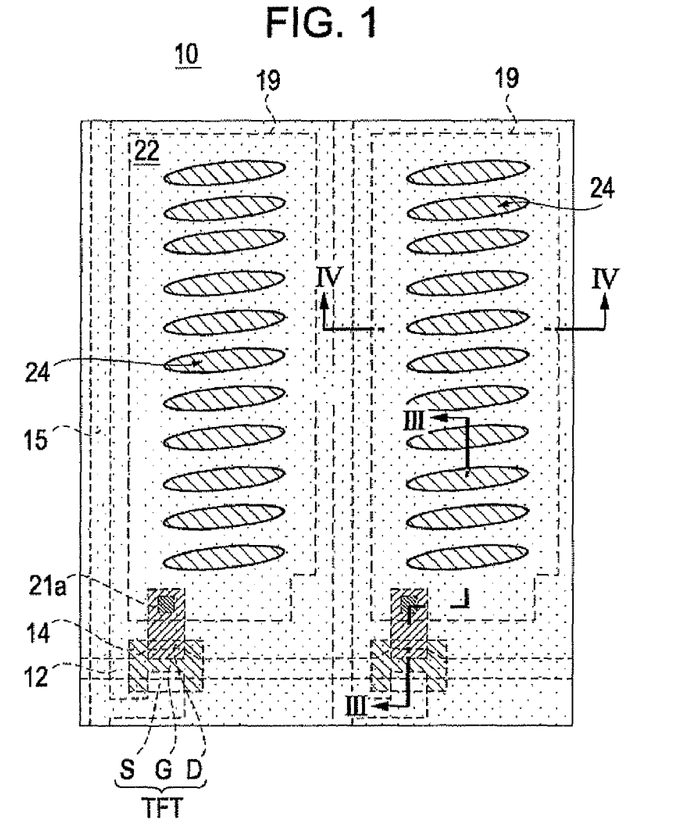
FIG. 1 is a plan view of two pixels of an array substrate of a liquid crystal display device according to an embodiment of the invention.
Figure 2:
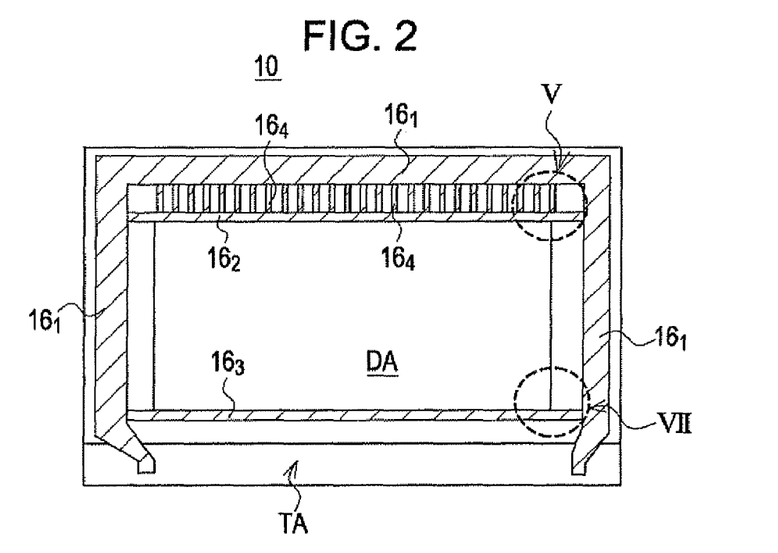
FIG. 2 is a schematic plan view of the array substrate of the liquid crystal display device according to the embodiment of the invention.
Figure 3:
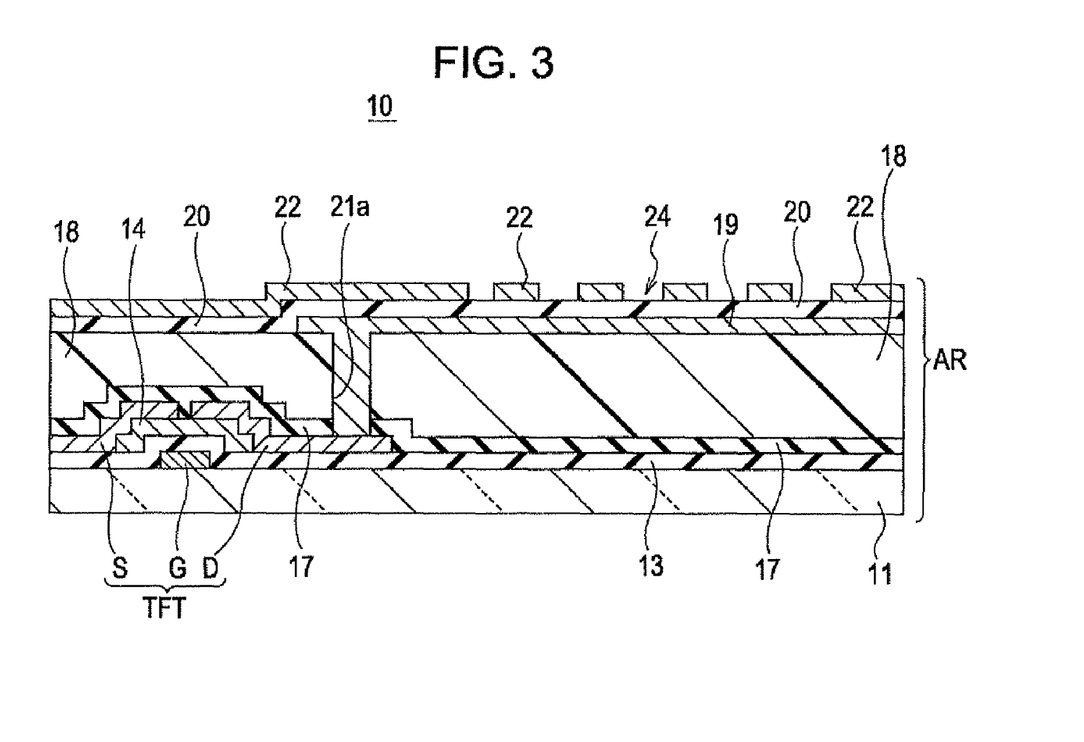
FIG. 3 is a schematic cross-sectional view taken along line III-III of FIG. 1.
Figure 4:
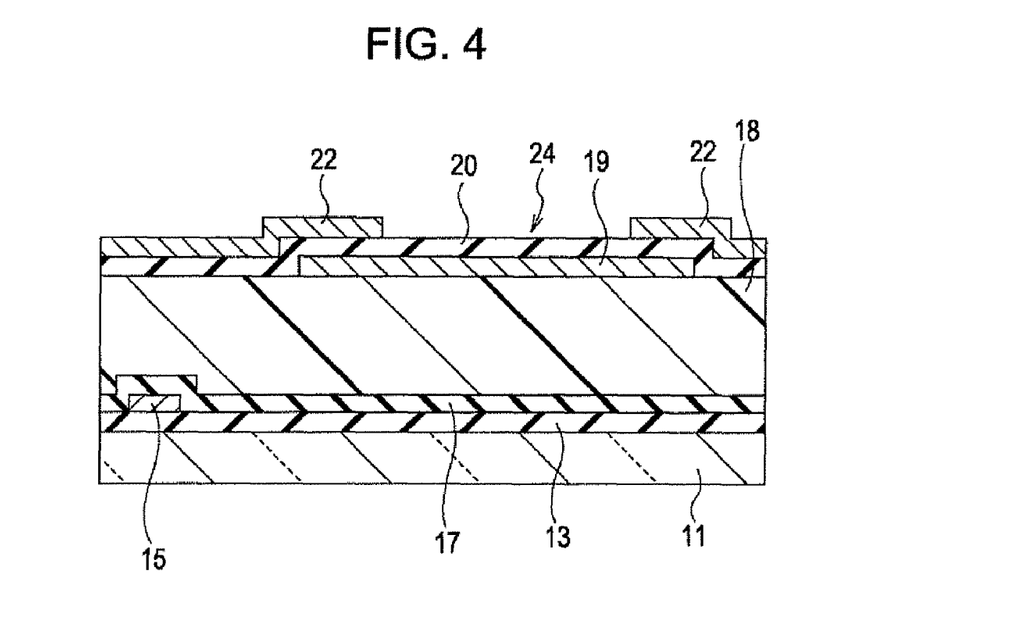
FIG. 4 is a schematic cross-sectional view taken along line IV-IV of FIG. 1.
Figure 5:
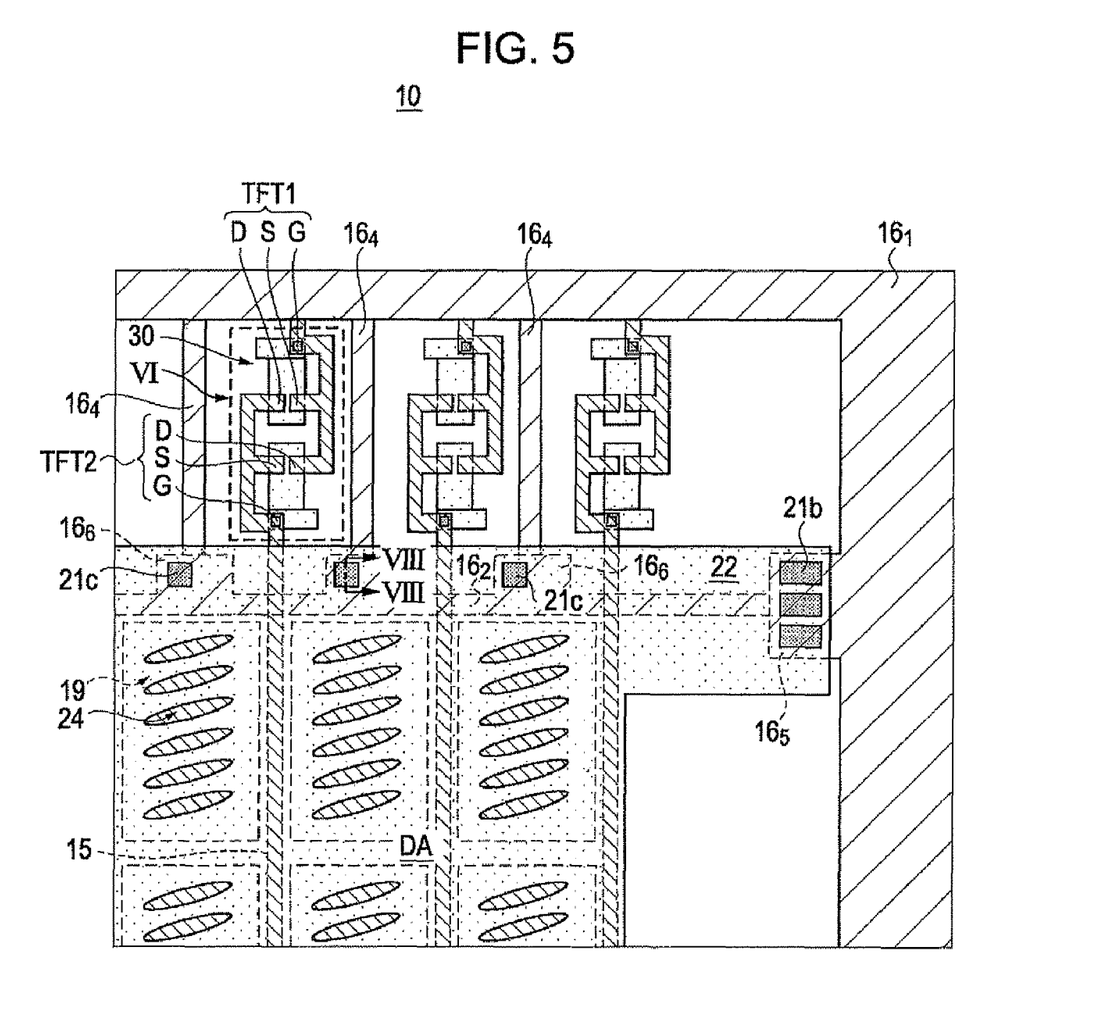
FIG. 5 is an enlarged plan view of a portion v of FIG. 2.
Figure 6A:
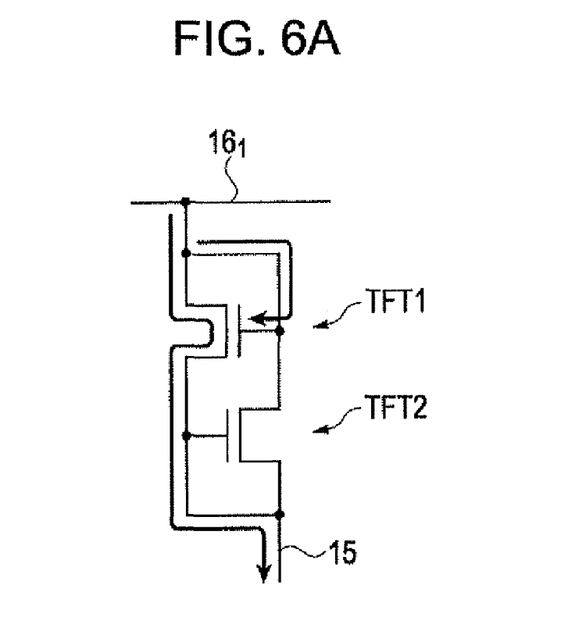
FIG. 6 is an enlarged plan view of a portion X of FIG. 5.
Figure 6B:
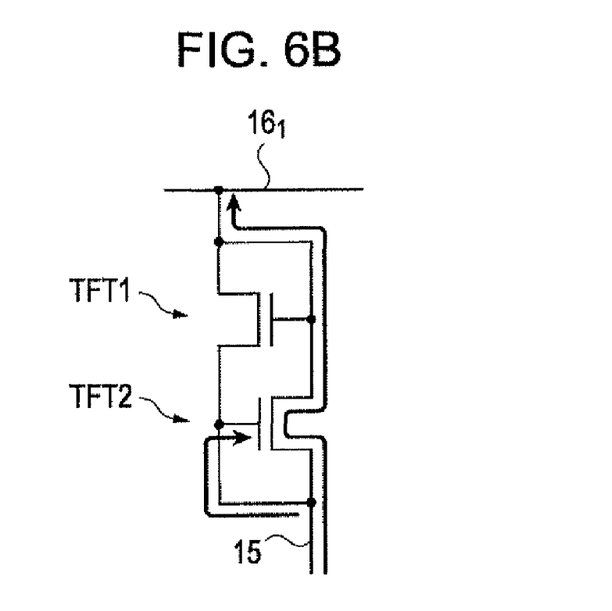
Figure 7:
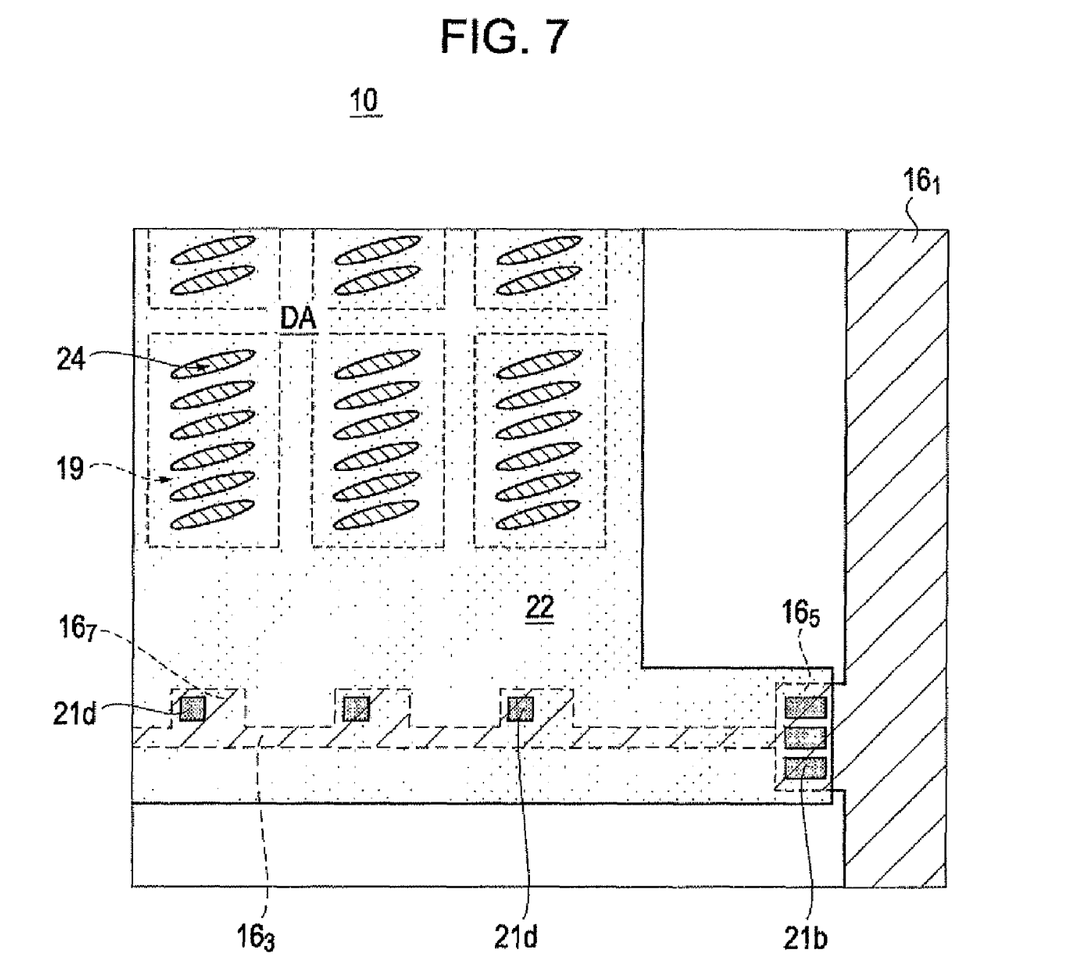
FIG. 7 is an enlarged plan view of a portion VII of FIG. 2.
Figure 8:
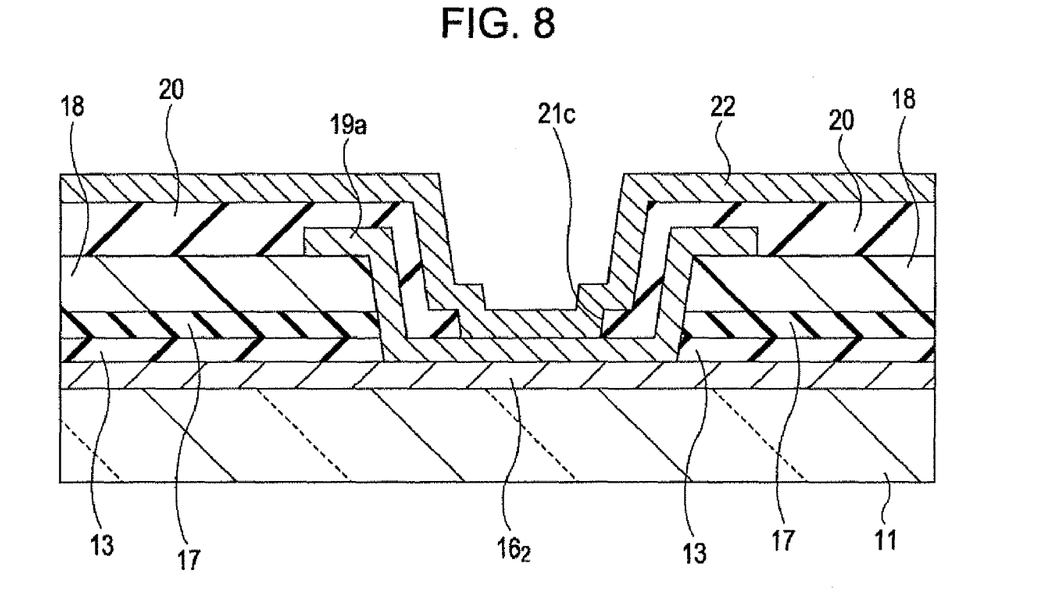
FIG. 8 is a schematic cross-sectional view taken along line VIII-VIII of FIG. 5.
Figure 9:
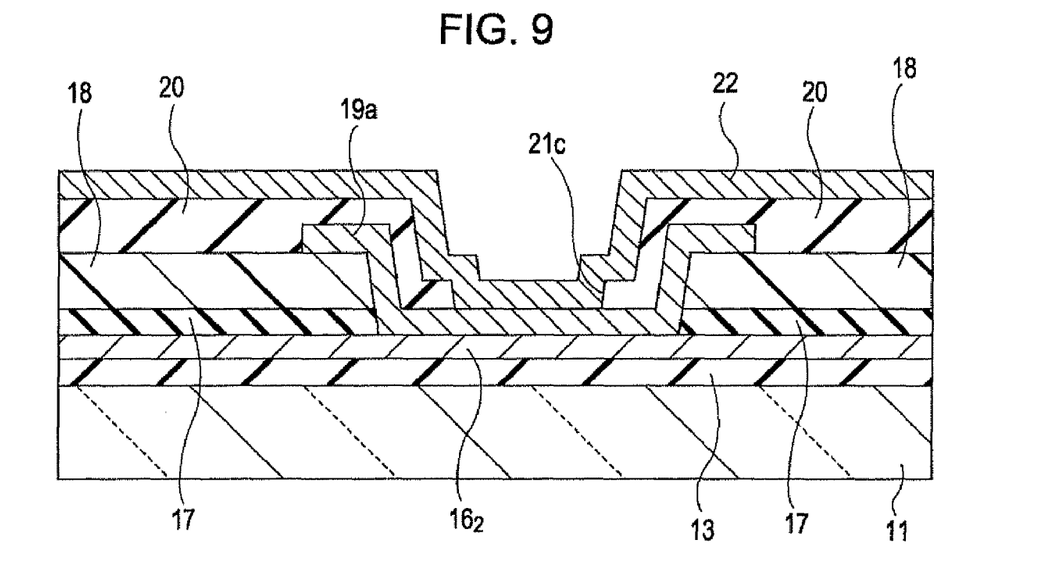
FIG. 9 is a schematic cross-sectional view corresponding to FIG. 8 according to a modified example of the embodiment of the invention.
Figure 10A:
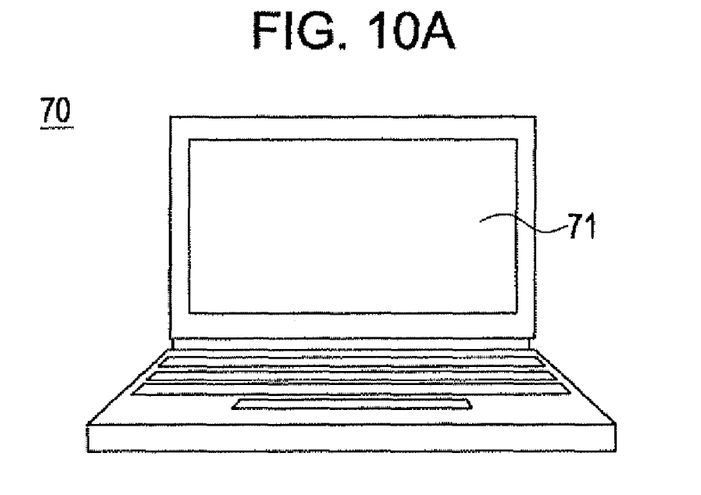
FIG. 10A is a view showing a personal computer including a liquid crystal display panel and FIG. 10B is a view showing a mobile telephone including a liquid crystal display panel.
Figure 10B:
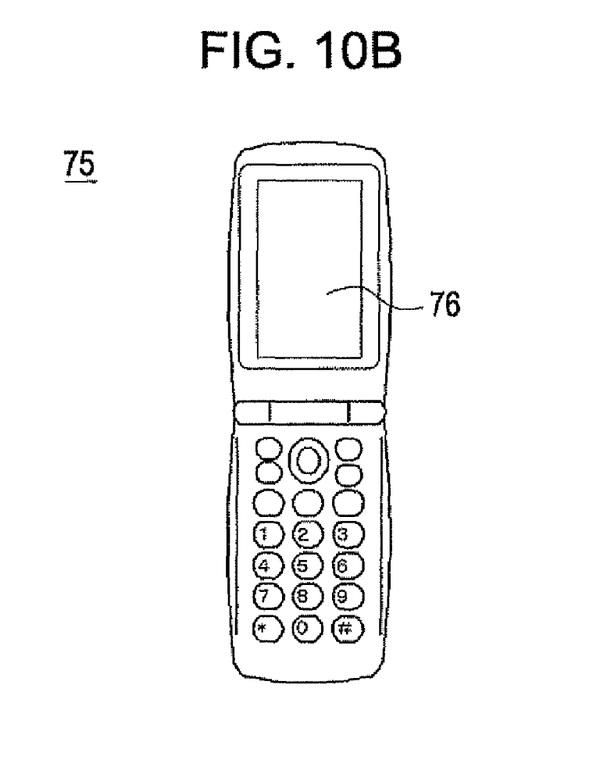

FIG. 1 is a plan view of two pixels of an array substrate of a liquid crystal display device according to an embodiment of the invention. FIG. 2 is a schematic plan view of the array substrate of the liquid crystal display device according to the embodiment of the invention. FIG. 3 is a schematic cross-sectional view taken along line III-III of FIG. 1. FIG. 4 is a schematic cross-sectional view taken along line IV-IV of FIG. 1. FIG. 5 is an enlarged plan view of a portion v of FIG. 2. FIG. 6 is an enlarged plan view of a portion X of FIG. 5. FIG. 7 is an enlarged plan view of a portion VII of FIG. 2. FIG. 8 is a schematic cross-sectional view taken along line VIII-VIII of FIG. 5. FIG. 9 is a schematic cross-sectional view corresponding to FIG. 8 according to a modified example of the embodiment of the invention. FIG. 10A is a view showing a personal computer including a liquid crystal display panel and FIG. 10B is a view showing a mobile telephone including a liquid crystal display panel.

Embodiment 1

In an FFS mode liquid crystal display device 10 of this embodiment, a liquid crystal layer (not shown) is sandwiched between a pair of opposite substrates. One of the pair of substrates is an array substrate AR (see FIG. 3) and the other thereof is a color filter substrate (not shown) on which color filters and so on are formed.

The array substrate AR is formed by forming a conductive layer such as aluminum or an aluminum alloy on the entire surface of a transparent substrate 11 (see FIG. 3) such as a glass substrate. Thereafter, a plurality of scan lines 12 are formed on a display area DA in parallel by a photolithography method and an etching method. In addition, a common line $16_1$ and a gate line (not shown) are formed in the periphery (hereinafter, referred to as a frame area) of the display area DA. The gate line is provided in the display area DA rather than the common line $16_1$. Furthermore, a first low-resistance line $16_2$, a second low-resistance line $16_3$, and a third low-resistance line $16_4$ are formed so as to become a pattern shown in FIG. 2.

The display area DA controls liquid crystal molecules of the liquid crystal layer on the basis of a signal for an image received from the outside of the liquid crystal display device 10. The display area DA is a laterally long display area DA, similar to the shape of the transparent substrate 11 having a rectangular shape.

In more detail, the common line $16_1$ thicker than other lines is formed so as to surround the outer circumference of the display area DA excluding a portion TA of the frame area in which a driver IC or various terminals is provided. That is, as shown in FIG. 2, for example, the common line $16_1$ is formed outside the display area DA along two short sides and one long side of the transparent substrate 11 having the rectangular shape. The driver IC or the various terminals is arranged on one long side of the transparent substrate 11 in which the common line $16_1$ is not formed.

Among the first to third low-resistance lines $16_2$, $16_3$ and $16_4$, the first and second low-resistance lines $16_2$ and $16_3$ form row-direction low-resistance lines are formed on the outside of the display area DA along a row direction and on the upper and lower side of the column direction.

That is, the first low-resistance line $16_2$ is formed in parallel to the common line $16_1$ formed along the long side of the transparent substrate 11 and is formed along the longitudinal direction of the display area DA outside the display area DA. It is preferable that the first low-resistance line $16_2$ is provided outside the display area DA, but is placed in as close contact as possible with the display area DA. Accordingly, it is preferable that the first low-resistance line $16_2$ is formed close to a lower electrode 19 (see FIG. 5) as a first electrode located on the outermost side of the display area DA.

The second low-resistance line $16_3$ is formed along the longitudinal direction of the display area DA, in which the common line $16_1$ of the transparent substrate 11 is not formed, outside the display area DA. The column direction is parallel to the signal line 15 and the row direction is parallel to the scan line 12.

The first and second low-resistance lines $16_2$ and $16_3$ are integrally connected with the common line $16_1$ at the both ends thereof in the row direction. That is, the both ends of the first and second low-resistance lines $16_2$ and $16_3$ which extend in the longitudinal direction of the display area DA are connected to the common line $16_1$ formed on the two short sides of the transparent substrate 11. Accordingly, when the both ends of the first and second low-resistance lines $16_2$ and $16_3$ are connected to the common line $16_1$, the apparent resistance of an upper electrode 22 as a second electrode is smaller compared with the case where one end of the first and second low-resistance lines $16_2$ and $16_3$ is connected to the common line $16_1$ and thus the better effect is obtained.

As shown in FIG. 2, the first low-resistance line $16_2$ formed on the upper side (the upper side of FIG. 2) of the outside of the display area DA is electrically connected to the common line $16_1$ by the third low-resistance line $16_4$ formed in the column direction of the pixel area. The third low-resistance line $16_4$ forms the low-resistance line in the column direction. Since the common line $16_1$ is not formed on the lower side of the column direction, the third low-resistance line $16_4$ is formed on only the upper side of the column direction, on the outside of the display area DA.

That is, the first low-resistance line $16_2$ and the common line $16_1$ which is formed on the long side of the transparent substrate 11 and is extended in parallel to the first low-resistance line $16_2$ are electrically connected by a connection line for connecting the both lines. The connection line which vertically extends from the first low-resistance line $16_2$ becomes the third low-resistance line $16_4$ which is the low-resistance line of the column direction.

The third low-resistance line $16_4$ may formed in every column of the pixel area which is formed in the display area DA or every plural columns. However, it is further preferable that the third low-resistance line $16_4$ is formed in every column of the pixel area which is formed in the display area DA, because the apparent resistance of the upper electrode 22 as the second electrode is decreased.

As shown in FIG. 5, an electrostatic protection circuit 30 is provided in a space between the first low-resistance line $16_2$ and the common line $16_1$. In more detail, one side of the electrostatic protection circuit 30 is connected to the end of the signal line 15 and the other side thereof is connected to the common line $16_1$. The electrostatic protection circuit 30 is provided in each column of the pixel area. Accordingly, the third low-resistance line $16_4$ is provided beside the electrostatic protection circuit 30 (avoid the electrostatic protection circuit 30) formed on the end of the signal line 15.

Now, the configuration and the function of the electrostatic protection circuit 30 will be briefly described. The electrostatic protection circuit 30 has two TFTs (TFT1 and TFT2) between the end of the signal line 15 and the common line $16_1$. As shown in FIG. 6A, if the common line 16 becomes a high voltage during the manufacturing process, charges are sent to the signal line 15. In contrast, if the signal line 15 becomes the high voltage, as shown in FIG. 6B, charges are sent to the common line $16_1$. That is, by the electrostatic protection circuit 30, it is possible to prevent a switching element formed in the display area DA from being destroyed by static electricity generated in the process of manufacturing the liquid crystal display device 10.

One end of the signal line 15 or the scan line 12 (not shown) is connected to the driver IC for input of the signal and the other end thereof is connected to the common line 16 via the electrostatic protection circuit 30. Accordingly, a predetermined distance between the display area DA and the common line $16_1$ is required in order to form the electrostatic protection circuit 30. Accordingly, when the connection line (the third low-resistance line $16_4$) is provided between the common line $16_1$ and the first low-resistance line $16_2$ with the electrostatic protection circuit 30 interposed therebetween, it is possible to reduce the resistance of the upper electrode 22.

In order to form the connection portion with the upper electrode 22, a connection portion $16_5$ protruding from the common line $16_1$ inward (the side of the display area DA) is formed. Connection portions $16e$ and $16_7$ each having a partially wide portion are formed in the first low-resistance line $16_2$ and the second low-resistance line $16_3$ (see FIGS. 5 and 7). The connection portions $16_6$ and $16_7$ formed in the first low-resistance line $16_2$ and the second low-resistance line $16_3$ are formed in each column of the pixel area formed in the display area DA.

Next, a gate insulating film 13 formed of a silicon nitride layer or a silicon oxide layer is coated on the entire surface thereof. Thereafter, an amorphous silicon (hereinafter, referred to as "a-Si") is coated on the entire surface of the gate insulating film 13 by a CVD method and a semiconductor layer 14 formed of an a-Si layer is formed in a TFT forming area by a photolithography method and an etching method. The area of the scan line 12 positioned at the position where the semiconductor layer 14 is formed forms a gate electrode G of the TFT (see FIG. 3).

Next, a conductive layer formed of aluminum or an aluminum alloy is coated on the entire surface of the transparent substrate 11 on which the semiconductor layer 14 is formed. In addition, the conductive layer is etched by the photolithography method and the etching method so as to form the signal line 15 including a source electrode S perpendicular the scan line 12 in the display area DA and form a drain electrode D in the TFT forming area. In addition, a source line (not shown) connected to the signal line 15 is formed in the frame area. In addition, the source electrode S and the drain electrode D of the signal line 15 partially overlap with the surface of the semiconductor layer 14.

Thereafter, a passivation film 17 is coated on the entire surface of the transparent substrate 11 obtained by the above process. Although a silicon nitride layer or a silicon oxide layer may be used as the passivation film 17, the silicon nitride layer is preferable in view of the insulating property. In addition, a planarization film 18 (also called an interlayer film) formed of acrylic resin or polyimide resin is laminated on the entire surface of the passivation film 17. Next, (1) a first contact hole $21a$ which passes through the planarization film 18 and the passivation film 17 so as to reach the surface of the drain electrode D, (2) a second contact hole $21b$ which passes through the planarization film 18, the passivation film 17, and the gate insulating film 13 so as to reach the surface of the connection portion $16_5$ of the common line $16_1$, a third contact hole $21c$ which reaches to the surface of the connection portion $16_6$ of the first low-resistance line $16_2$ and a fourth contact hole $21d$ which reaches to the surface of the connection portion $16_7$ of the second low-resistance line $16_3$ are simultaneously formed. The first to fourth contact holes $21a$ to $21d$ may be formed by a plasma etching method which is one of a dry etching method.

Next, a lower transparent conductive layer formed of ITO or IZO is laminated. At this time, the lower transparent conductive layer is electrically connected to the drain electrode D, the connection portion $16_5$ of the common line $16_1$, the connection portion $16_6$ of the first low-resistance line $16_2$, and the connection portion $16_7$ of the second low-resistance line $16_3$, Thereafter, the transparent conductive layer is etched by the photolithography method and the etching method so as to form the lower electrode 19 in each pixel area of the display area DA. A lower transparent conductive layer $19a$ having a predetermined pattern shown in FIG. 8 is formed in the connection portion $16_5$ of the common line $16_1$, the connection portion $16_6$ of the first low-resistance line $16_2$, and the connection portion $16_7$ of the second low-resistance line $16_3$. The configurations formed in the connection portion $16_6$ of the common line $16_1$, the connection portion $16_6$ of the first low-resistance line $16_2$, and the connection portion $16_7$ of the second low-resistance line $16_3$ are substantially equal although the shapes or the sizes of the contract holes are different. In the liquid crystal display device 10 of the embodiment, the lower electrode 19 corresponds to the pixel electrode.

In addition, an insulating film 20 formed of a silicon nitride layer or a silicon oxide layer is formed over the entire surface of the transparent substrate 11, on which the lower electrode 19 is formed, with a predetermined thickness. The insulating film 20 is formed under a milder condition than the condition of forming the gate insulating film 13 or the passivation film 17, that is, a low-temperature film forming condition, in order to prevent the surface of the planarization film 18 or the lower electrode 19 from being damaged.

Next, the insulating film formed in the second contact hole $21b$, the third contact hole $21c$ and the fourth contact hole $21d$ is etched and removed from the surface of the insulating film 20. A lower transparent conductive layer $19a$ in the second to fourth contact holes $21b$ to $21d$ is exposed. Thereafter, a transparent conductive layer formed of ITO or IZO is formed on the entire surface of the transparent substrate 11. At this time, the common line $16_1$, the first low-resistance line $16_2$ and the second low-resistance line $16_3$ are electrically connected to each other by the transparent conductive layer via the second to fourth contact holes $21b$ to $21d$.

Thereafter, the transparent conductive layer is etched by the photolithography method and the etching method so as to coat the display area DA with the transparent conductive layer. In each pixel area, the upper electrode 22 having a plurality of slits 24 for generating the fringe field effect is formed by the transparent conductive layer. At this time, as shown in FIG. 8, the upper electrode 22 is electrically connected to the connection portion $16_5$ of the common line $16_1$, the connection portion $16_6$ of the first low-resistance line $16_2$, and the connection portion $16_7$ of the second low-resistance line $16_3$ via the lower transparent conductive layer $19a$. In the liquid crystal display device 10 of the embodiment, the upper electrode 22 corresponds to the common electrode.

In order to reduce the resistance of the upper electrode 22, the transparent conductive layer configuring the upper electrode 22 may extend up to the common line $16_1$ formed along the long side of the transparent substrate 11 so as to electrically connect the upper electrode 22 to the common line $16_1$. However, the electrostatic protection circuit 30 is interposed between the display area DA and the common line $16_1$. Accordingly, a predetermined distance is required between the display area DA and the common line $16_1$. At this time, since it is preferable that the upper electrode 22 is electrically connected to the common line $16_1$ which is the line formed of metal in as close contact as possible with the display area DA, it is preferable that the upper electrode 22 and the common line $16_1$ are electrically connected via the first low-resistance line $16_2$. The upper electrode 22 extends to the position where the first low-resistance line $16_2$ and the second low-resistance line $16_3$ in plan view. Accordingly, it is possible to reduce the size of the liquid crystal display device 10, compared with the case where the first low-resistance line $16_2$ and the second low-resistance line $16_3$ are provided outside the upper electrode 22.

On the common line $16_1$, a seal material (not shown) for bonding the pair of substrate is positioned. Since the transparent conductive layer configuring the upper electrode 22 and the seal material have bad adhesion, it is preferable that the upper electrode 22 is placed as far as possible from the seal material. From this viewpoint, the above contents are excellent.

The upper electrode 22 is electrically connected to the common line $16_1$, the first low-resistance line $16_2$ and the second low-resistance line $16_3$ via the second to fourth contact holes 21b to 21d. Thereafter, an alignment film (not shown) is provided on the entire surface of the upper electrode 22 so as to complete the array substrate AR of the liquid crystal display device 10 of the embodiment.

Although the color filter substrate facing the array substrate AR is not shown, the substantially same substrate as the color filter substrate for the existing FFS mode liquid crystal display panel may be used. That is, on the color filter substrate, a color filter layer of respective colors is formed at the position facing the lower electrode 19 functioning as the pixel electrode and an alignment film is provided on the surface of the color filter layer. A black matrix is provided at the position facing the TFT and the position facing the scan line 12 and the signal line 15 between the color filter layer and the transparent substrate. Next, the array substrate AR and the color filter substrate face each other and the liquid crystal is filled between the substrates, thereby obtaining the liquid crystal display device 10 of the embodiment.

According to the liquid crystal display device 10 of the embodiment, the upper electrode 22 is electrically connected to the common line $16_1$, the first low-resistance line $16_2$ and the second low-resistance line $16_3$ Via the second to fourth contact holes 21b to 21d. Accordingly, the first low-resistance line $16_2$ and the second low-resistance line $16_3$ are directly electrically connected to the common line $16_1$ and the first low-resistance line $16_2$ is electrically connected to the common line $16_1$ via the third low-resistance line $16_4$. Accordingly, since the upper electrode 22 is electrically connected to the common line 116 via the plurality of contact holes, the apparent resistance of the upper electrode 22 is significantly reduced although the upper electrode 22 is thin in order to prevent a burn-in phenomenon. Therefore, according to the liquid crystal display panel of the embodiment, since the signal applied to the upper electrode 22 functioning as the common electrode does not deteriorate, lateral crosstalk is low even in a laterally long liquid crystal display device and a liquid crystal display device with good display quality is obtained. In particular, in a small-sized liquid crystal display device, the influence of the resistance value of the upper electrode 22 is low. In contrast, in a middle-sized or large-sized liquid crystal display device having a size of 6 inches or 7 inches, the influence of the resistance value of the upper electrode 22 is increased. Accordingly, the invention is particularly efficient in the middle-sized or large-sized liquid crystal display device.

In the embodiment, before the upper transparent conductive layer is formed, a process of etching and removing the insulating film formed in the second contact hole 21b, the third contact hole 21c and the fourth contact hole 21d is performed. However, since this process is necessary even when a terminal for mounting the driver IC, a test terminal and an external connection terminal (all not shown) are simultaneously formed in a portion TA of the frame area of the liquid crystal display device 10, this process is not newly added.

The common line $16_1$, the first low-resistance line $16_2$, the second low-resistance line $16_3$ and the third low-resistance line $16_4$ may be formed of the same material as the scan line 12 or the same material as the signal line 15. Accordingly, since these lines can be simultaneously formed with the scan line 12 or the signal line 15, these lines can be readily formed without changing the manufacturing process. The cross-sectional view corresponding to FIG. 8 in this case is shown in FIG. 9 and the common line $16_2$, the first low-resistance line $16_2$, the second low-resistance line $16_3$ and the third low-resistance line $16_4$ are formed on the surface of the gate insulating film 13. Alternatively, all or some of the common line $16_1$, the first low-resistance line $16_2$, the second low-resistance line $16_3$ and the third low-resistance line $16_4$ may be formed of the same material as the signal line 15.

The FFS mode liquid crystal display device was described as the embodiment. The liquid crystal display device may be used in an electronic apparatus such as a personal computer, a mobile telephone, and a personal digital assistant. Among them, an example of using a display unit (liquid crystal display panel) 71 in a personal computer 70 is shown in FIG. 10A and an example of using a display unit (liquid crystal display panel) 76 in a mobile telephone 75 is shown in FIG. 10B. The basic configurations of the personal computer 70 and the mobile telephone 75 are well known to those skilled in the art and thus the detailed description thereof will be omitted.

The invention is not limited to the above-described embodiment and may be embodied by the following examples.

MODIFIED EXAMPLE 1

As described above, although the common line $16_1$ is formed so as to surround the display area DA (along two short sides and one long side of the display area DA), for example, the common line $16_1$ may be formed along one long side or two long sides. In this case, if the first low-resistance line $16_2$ and the second low-resistance line $16_3$ are provided on the side in which the common line $16_1$ is formed in the display area DA, the first low-resistance line $16_2$, the second low-resistance line $16_3$ and the common line $16_1$ may be connected by the third low-resistance line $16_4$ (connection line).

MODIFIED EXAMPLE 2

As described above, although the first low-resistance line $16_2$ and the second low-resistance line $16_3$ are formed along the long side of the display area DA, for example, the low-resistance line may be continuously formed in the periphery (the whole circumference or three sides) of the display area DA. In this case, for example, the low-resistance line and the common line $16_1$ may be electrically connected and the low-resistance line and the common line may be electrically connected using the connection line (the third low-resistance line $16_4$).

MODIFIED EXAMPLE 3

As described above, although the first low-resistance line $16_2$ and the second low-resistance line $16_3$ are provided in the row direction if the display area DA is laterally long, the low-resistance line may be provided in the longitudinal direction of the display area DA. For example, if the display area DA is laterally long, the low-resistance line is provided in the column direction. Accordingly, it is possible to suppress the resistance of the both ends of one side of the upper electrode 22 from being increased in plan view, compared with the case where the first low-resistance line $16_2$ and the second low-resistance line $16_3$ are formed in a short direction of the display area DA.

MODIFIED EXAMPLE 4

As described above, although the configurations of first low-resistance line $16_2$, the second low-resistance line $16_3$ and the third low-resistance line $16_4$ are used in the FFS mode transmissive type liquid crystal display device 10, for example, they may be applied to a reflective semi-transmissive type liquid crystal display device or an IPS mode or VA mode liquid crystal display device. In the transmissive type liquid crystal display device, the liquid crystal display device may be configured such that the lower electrode 19 becomes an upper electrode and the upper electrode 22 becomes a lower electrode.

What is claimed is:

1. A liquid crystal display device comprising:
   a pair of transparent substrates including a liquid crystal layer interposed therebetween,
   wherein, at the liquid crystal layer side of one of the pair of transparent substrates,
   a plurality of scan lines and a plurality of signal lines are arranged in a display area in a matrix,
   first electrodes are formed in pixel areas partitioned by the scan lines and the signal lines,
   a second electrode is formed on the first electrodes with an insulating film interposed therebetween over at least the display area,
   a common line is formed outside the display area, and
   the second electrode is electrically connected to the common line via a low-resistance line which is formed along at least one side of the display area.

2. The liquid crystal display device according to claim 1, wherein the low-resistance line is formed between the display area and the common line in plan view.

3. The liquid crystal display device according to claim 1, wherein the low-resistance line is formed so as to overlap with the second electrode which extends to the outside of the display area in plan view.

4. The liquid crystal display device according to claim 1, wherein the both ends of the low-resistance line are electrically connected to the common line.

5. The liquid crystal display device according to claim 1, wherein:
   the common line is positioned at a position separated from the display area in parallel, and
   the low-resistance line and the common line are electrically connected via a connection line.

6. The liquid crystal display device according to claim 5, wherein the low-resistance line and the connection line are formed of the same material as the scan lines or the signal lines.

7. The liquid crystal display device according to claim 1, wherein:
   the display area has a rectangular shape, and
   the low-resistance line is formed in a longitudinal direction of the display area.

8. An electronic apparatus comprising the liquid crystal display device according to claim 1.

* * * * *